United States Patent
Farooq et al.

(10) Patent No.: US 9,263,324 B2
(45) Date of Patent: Feb. 16, 2016

(54) 3-D INTEGRATION USING MULTI STAGE VIAS

(71) Applicant: GLOBALFOUNDRIES Inc., Grand Cayman (KY)

(72) Inventors: Mukta G. Farooq, Hopewell Junction, NY (US); Troy L. Graves-Abe, Wappingers Falls, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/080,562

(22) Filed: Nov. 14, 2013

(65) Prior Publication Data
US 2014/0073134 A1  Mar. 13, 2014

Related U.S. Application Data

(62) Division of application No. 13/101,268, filed on May 5, 2011, now Pat. No. 8,853,857.

(51) Int. Cl.
*H01L 21/4763* (2006.01)
*H01L 21/768* (2006.01)
*H01L 23/48* (2006.01)

(52) U.S. Cl.
CPC .... *H01L 21/76877* (2013.01); *H01L 21/76898* (2013.01); *H01L 23/481* (2013.01); *H01L 2924/0002* (2013.01)

(58) Field of Classification Search
CPC ............... H01L 23/49827; H01L 2224/48091; H01L 25/0657; H01L 2924/0002; H01L 2924/00; H01L 21/76877; H01L 21/76898; H01L 23/481
USPC .................................. 438/666–675, 618–640
See application file for complete search history.

(56) References Cited

U.S. PATENT DOCUMENTS

| | | |
|---|---|---|
| 5,156,998 A | 10/1992 | Chi et al. |
| 5,166,097 A | 11/1992 | Tanielian |

(Continued)

FOREIGN PATENT DOCUMENTS

WO  2010120448 A2  10/2010

OTHER PUBLICATIONS

PCT/ISA/220 Notification of Transmittal of the International Search Report and the Written Opinion of the International Searching Authority, or the Declaration Dated Oct. 23, 2012, International Application No. PCT/US2012/036038.

(Continued)

*Primary Examiner* — H Tsai
(74) *Attorney, Agent, or Firm* — Heslin Rothenberg Farley & Mesiti P.C.

(57) ABSTRACT

A TSV can be formed having a top section via formed through the top substrate surface and a bottom section via formed through the bottom substrate surface. The top section cross section can have a minimum cross section corresponding to design rules, and the top section depth can correspond to a workable aspect ratio. The top section via can be filled or plugged so that top side processing can be continued. The bottom section via can have a larger cross section for ease of forming a conductive path therethrough. The bottom section via extends from the back side to the bottom of the top section via and is formed after the substrate has been thinned. The TSV is can be completed by forming a conductive path after removing sacrificial fill materials from the joined top and bottom section vias.

6 Claims, 10 Drawing Sheets

(56) References Cited

U.S. PATENT DOCUMENTS

| | | | |
|---|---|---|---|
| 5,283,107 A | | 2/1994 | Bayer et al. |
| 6,716,737 B2 | * | 4/2004 | Plas et al. ............... 438/612 |
| 7,563,714 B2 | | 7/2009 | Erturk et al. |
| 7,589,009 B1 | | 9/2009 | Kar-Roy et al. |
| 7,741,148 B1 | | 6/2010 | Marimuthu et al. |
| 7,816,231 B2 | | 10/2010 | Dyer et al. |
| 7,816,776 B2 | | 10/2010 | Choi |
| 2004/0016942 A1 | | 1/2004 | Miyazawa et al. |
| 2005/0233581 A1 | * | 10/2005 | Soejima et al. ............ 438/667 |
| 2007/0281473 A1 | | 12/2007 | Clark et al. |
| 2009/0020865 A1 | | 1/2009 | Su |
| 2009/0283871 A1 | | 11/2009 | Chang et al. |
| 2010/0032764 A1 | | 2/2010 | Andry et al. |
| 2010/0059791 A1 | | 3/2010 | Takagi |
| 2010/0105169 A1 | | 4/2010 | Lee et al. |
| 2010/0164109 A1 | | 7/2010 | Chiou et al. |
| 2010/0176469 A1 | * | 7/2010 | Schmollngruber et al. .. 257/419 |
| 2010/0264548 A1 | * | 10/2010 | Sanders et al. ............ 257/774 |

OTHER PUBLICATIONS

N. Minas; "3D Integration: Circuit Design, Test, and Reliability Challenges"; 2010 IEEE.

K. Zoschke; "Evaluation of Thin Wafer Processing using a Temporary Wafer Handling System as Key Technology for 3D System Integration"; 2010 Electronic Components and Technology Conference, IEEE.

Z. Chen; "Modeling of Electromigration of the Through Silicon Via Interconnects"; 2010 11th International Conference on Electronic Packaging Technology & High Density Packaging, IEEE.

J. Dukovic; "Through-Silicon-Via Technology for 3D Integration"; 2010 IEEE.

M. Puech; "Fabrication of 3D Packaging TSV using DRIE"; DTIP of MEMS & MOEMS Apr. 9-11, 2008, ISBN 978-2-35500-006-5.

M. W. Newman; "Fabrication and Electrical Characterization of 3D Vertical Interconnects"; 2006 Electronic Components and Technology Conference, IEEE.

* cited by examiner

3-D INTEGRATION USING MULTI STAGE VIAS

CROSS REFERENCE TO RELATED APPLICATIONS

This application is a division of commonly-owned, copending U.S. patent application Ser. No. 13/101,268 entitled 3-D INTEGRATION USING MULTI STATE VIAS and filed on May 5, 2011.

FIELD OF THE INVENTION

The present invention relates to a semiconductor structure, and techniques for fabricating the same. More particularly, the invention relates to a multi-stage structure to connect integrated circuitry and devices in stacked semiconductor chips.

BACKGROUND OF THE INVENTION

There continues to be a demand for more densely formed integrated circuits. One approach has been to reduce the physical scale of the circuit components so more can be formed within a given lateral area of a chip. Another approach is to vertically integrate two or more chips, each having semiconductor devices and interconnect wiring (e.g., integrated circuitry) using three-dimensional (3D) chip-to-chip stacking technology that bonds chip to chip, chip to wafer, or wafer to wafer. 3D stacking enables a greater density of integrated active circuits, enhanced performance, and improved form factors, among other gains. At present, there are many applications for 3D stacking technology, including high performance processing devices, video and graphics processors, high density and high bandwidth memory chips, among others.

Such 3D structures employ through-substrate vias (TSVs) to provide electrical connection to or among the devices and integrated circuitry formed on the multiple semiconductor substrate layers. For example, a 3D structure will have at least a lower chip separating the external connection (packaging) and an upper chip. Power for the devices of the upper chip can be delivered by a TSV through the lower chip.

A TSV preferably has high conductivity while consuming a minimum of area on the substrate surface, since such area could otherwise be used for additional functionality such as added logic or memory. By this measure, the area consumed by a TSV should be no more than an area sufficient to handle the design current load, that is, able to avoid electromigration effects, overheating and/or voltage drops. If such minimum area were circular, the diameter of the area could be referred to as the "current minimum dimension". A TSV's axis is typically substantially normal to the planar orientation of the chip. By virtue of extending through the depth of a chip, a TSV's length is approximately the chip thickness, which can be orders of magnitude longer than a typical interconnect via which only extends through at most a few of the back-end-of-the-line (BEOL) interconnect layers. In other words, the TSV aspect ratio of length vs. the 'current minimum dimension' can be very high.

Copper's high conductivity can make it a preferable material for TSVs, but process challenges such as forming sufficiently uniform liner, barrier and/or seed layers, and/or conductively filling the TSV, effectively limit copper features to moderate aspect ratios. For a given depth through the substrate, the TSV width must generally be increased above the current minimum dimension to maintain a moderate aspect ratio. The relatively massive resulting copper TSV presents further integration and reliability challenges including CTE mismatch and wafer bowing. Higher aspect ratio features can be formed with tungsten, but tungsten has lower conductivity. For an equivalent current capacity, a tungsten TSV must have a greater cross section than a copper TSV, either as a single wider TSV, or as a set of narrow TSVs.

SUMMARY OF THE INVENTION

According to this disclosure, a TSV can be formed by a process that can avoid many of the problems associated with prior art TSVs. The disclosed TSV includes a first section via formed through the top substrate surface and joined to a second section via formed through the bottom substrate surface. The top section cross section can have a cross section corresponding to a current minimum dimension, and the top section depth can correspond to a workable aspect ratio. The top section via can be filled or plugged with a sacrificial fill material so that top side processing can be continued. The fill material can be selected to limit thermal expansion differences relative to the substrate. The bottom section via extends from the back side to the bottom of the top section via, and is formed after the substrate has been thinned. The TSV can be completed after the top and bottom section vias are joined. The conductive path of the TSV can be formed as a single deposition of material extending continuously from the top substrate surface to the bottom substrate surface. According to some embodiments the top via section can be lined with dielectric material, and in particular embodiments the dielectric material is thermal oxide.

According to the present disclosure, wafer bowing that results from forming a TSV in a (wafer) substrate and then thinning that substrate can be avoided by forming a top section of a TSV before, but not conductively-filling the top section and not forming and conductively-filling a bottom section of such TSV until after, thinning the substrate. In addition, the problem of forming a large cross section feature in order to maintain a manageable total aspect ratio of that feature can be solved by sizing a top section of a TSV according to current loading criteria such that the top cross sectional area is minimized and completing the TSV with a second section that can have a larger cross sectional area.

According to another aspect of the present disclosure, a method of forming a multi-stage TSV is provided. The method includes providing a substrate having a blind via formed therein, the blind via having a front end sealed by fill material and abutting a contact disposed above a front side of the substrate, the blind via having a back end within said substrate and extending into said substrate less than said initial depth; forming a back side via that opens said back end. In some embodiments a conductive path through the resulting multi-stage cavity can be formed after removing the fill material to expose the contact.

BRIEF DESCRIPTION OF THE DRAWINGS

The exemplary embodiments, both as to organization and method of operation, may best be understood by reference to the detailed description which follows taken in conjunction with the accompanying figures.

DETAILED DESCRIPTION OF THE INVENTION

Figure 1:
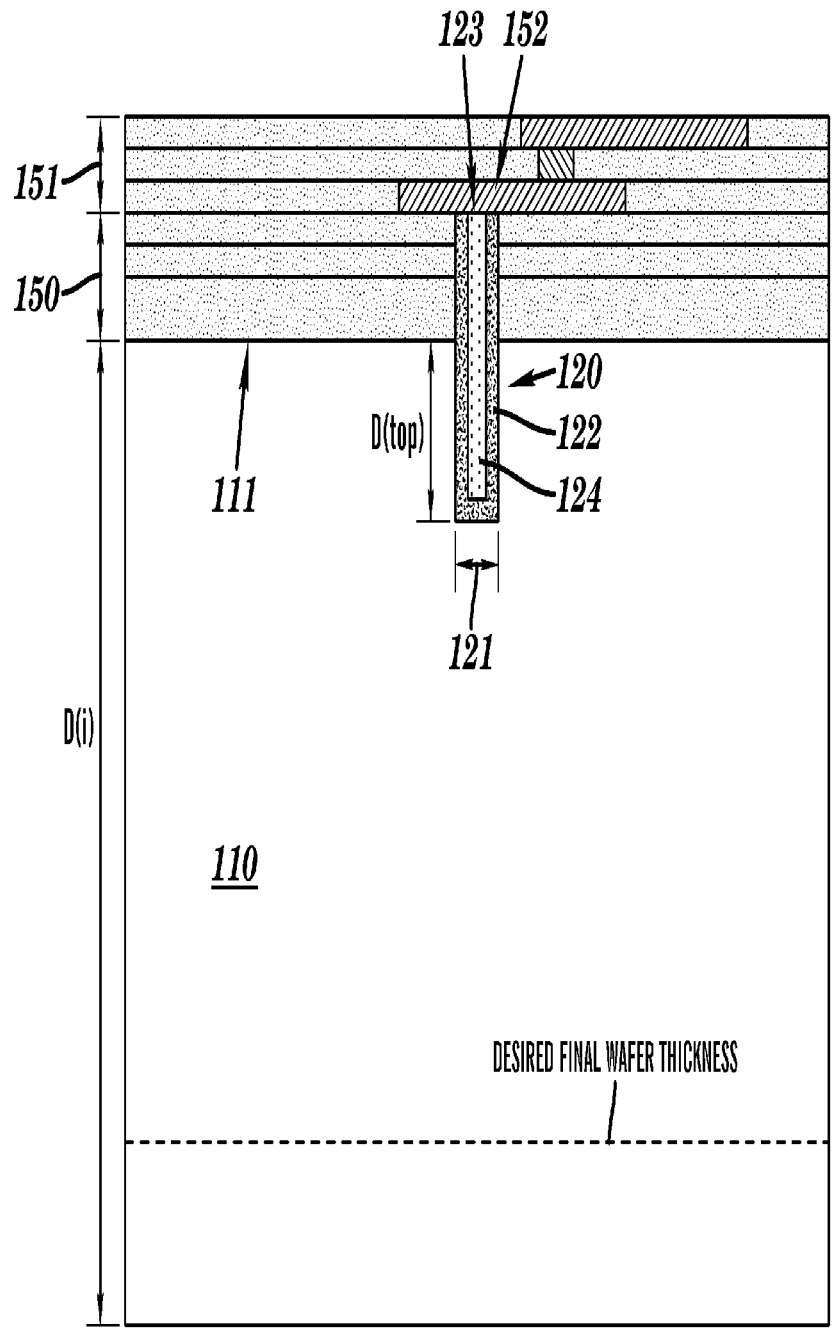
FIGS. 1 and 2 illustrate a top section of a multi-stage via extending into the top surface of a substrate.

As stated above, the present disclosure relates to novel TSV structures and methods of forming the same, which are now described in detail with accompanying figures. It is noted that like reference numerals refer to like elements across different embodiments. The drawings are not necessarily drawn to scale.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring now to FIG. 1, there is illustrated a semiconductor substrate 110 having an initial thickness D(i). One or more semiconductor devices (not shown) can be formed on top surface 111 of the substrate. One or more dielectric layers 150 are disposed over top surface 111. Top section via 120 can be formed through dielectric layer 150, extending through top surface 111 and into substrate 110, utilizing lithography and etching. Typically, reactive ion etch is used, but the invention is not so limited.

Top section via 120 has a cross section 121. That cross section can be dictated by at least two factors. One factor is the metallization layer in which the feature is to be formed, since there are practical limitations on the feature size that can be formed in any given layer. The second factor is the electrical design load since the conductive path ultimately formed must have a cross section sufficient to handle the current (and given the materials constituting the conductive path and the insulating material through which it is formed materials) without suffering electromigration, overheating, voltage drops, or other load induced flaws (the 'current minimum dimension'). In situations where the current minimum dimension is larger than can be formed in a particular layer, one option is to form a plurality of features across which the current load can be divided by connecting them in parallel. Cross section 121 can be in the range of 0.04 to 5 microns, but a larger or smaller dimension is also possible. For certain embodiments, cross section 121 may be in the range of 0.04 to 1.0 microns, while in other embodiments it may be in the range of 1.2 to 4.0 microns.

The depth of top section via 120 can be selected relative to cross section 121 based on a manageable aspect ratio, where the particular design selections, such as a given etch chemistry or the fill characteristics for a particular conductive material might determine the extent of a 'manageable' aspect ratio. Top section via 120 extends into substrate 110 to a depth D(top). In some embodiments D(top) is 2-10 microns. Top section via does not at this point contact another feature at its bottom end, so can be referred to as a 'blind via'.

Figure 3:
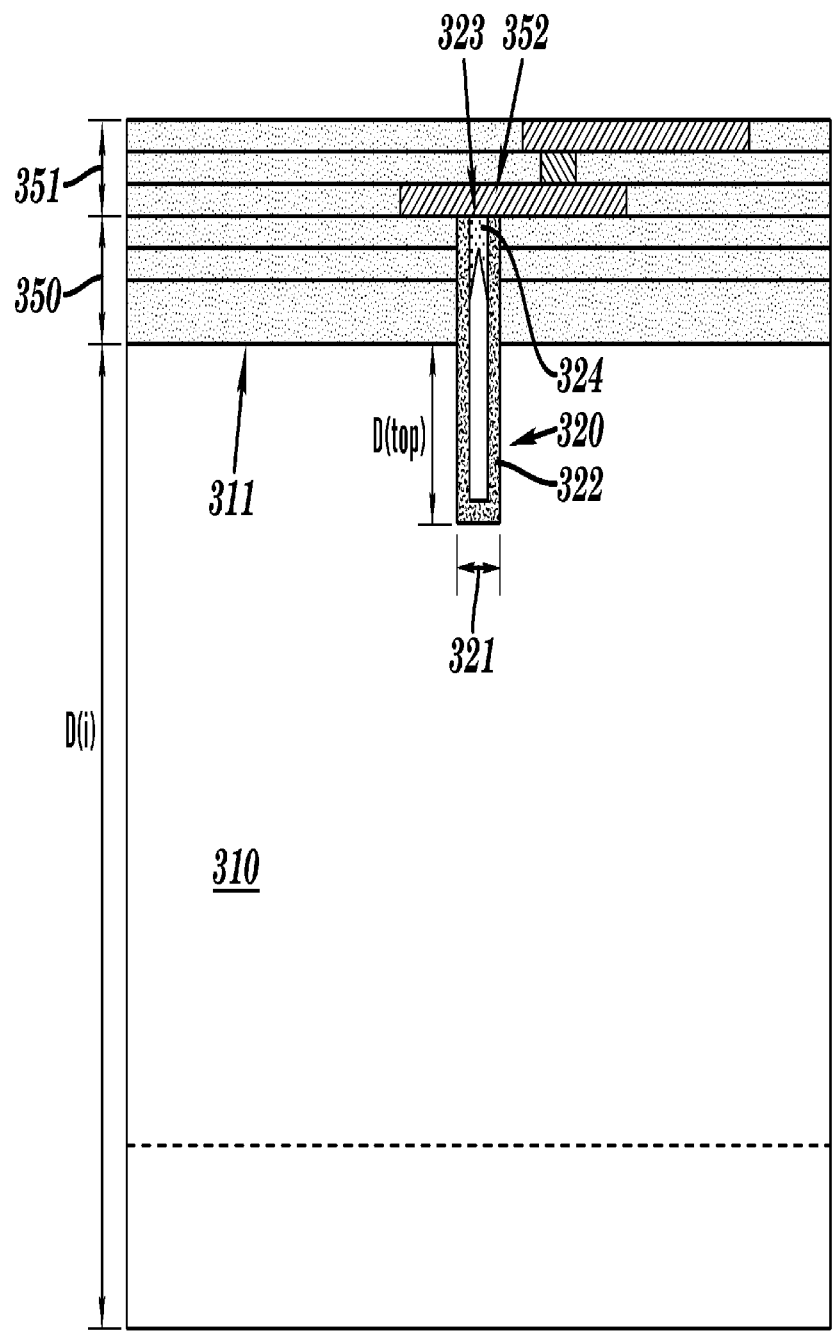
FIG. 3 illustrates a top section of a multi-stage via that has been plugged with fill material.

Top section via 120 can optionally be lined at this point, using known techniques. Liner 122 can be formed by deposition of conformal inorganic or organic dielectric such as CVD oxide, organosilicate, thermal oxide, or CVD nitride. Further processing of substrate 110 can proceed after top section via 120 is filled by a fill material 124, but it is not necessary that the top section via be completely filled. In some embodiments, e.g., as shown in FIG. 3, it can be sufficient and even preferable to plug and not completely fill top end 323 of top via 320 with fill material 324. Returning to FIG. 1, fill material 124 can be polysilicon or a dielectric, or one or more of the materials appropriate for liner 122, or combinations thereof. The fill material can be a sacrificial material (ultimately removed from the via), in which case it can be chosen to enable its removal by selective etch. If desired, any liner material 122 that may have deposited over the surface of layer 150 can be removed before or after fill material 124 is deposited. CMP can remove unwanted fill material and liner material from the surface of layer 150. Contact 152 directly contacting the top end 123 of the top section via 120 can be formed in further dielectric layers 151. Contact 152 can be a conventional BEOL contact pad or via, comprising for example Cu or W.

The substrate herein may comprise any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs). Further, substrate 110 can be single crystalline, polycrystalline, amorphous, or have a combination of at least two of a single crystalline portion, a polycrystalline portion, and an amorphous portion.

Figure 2:
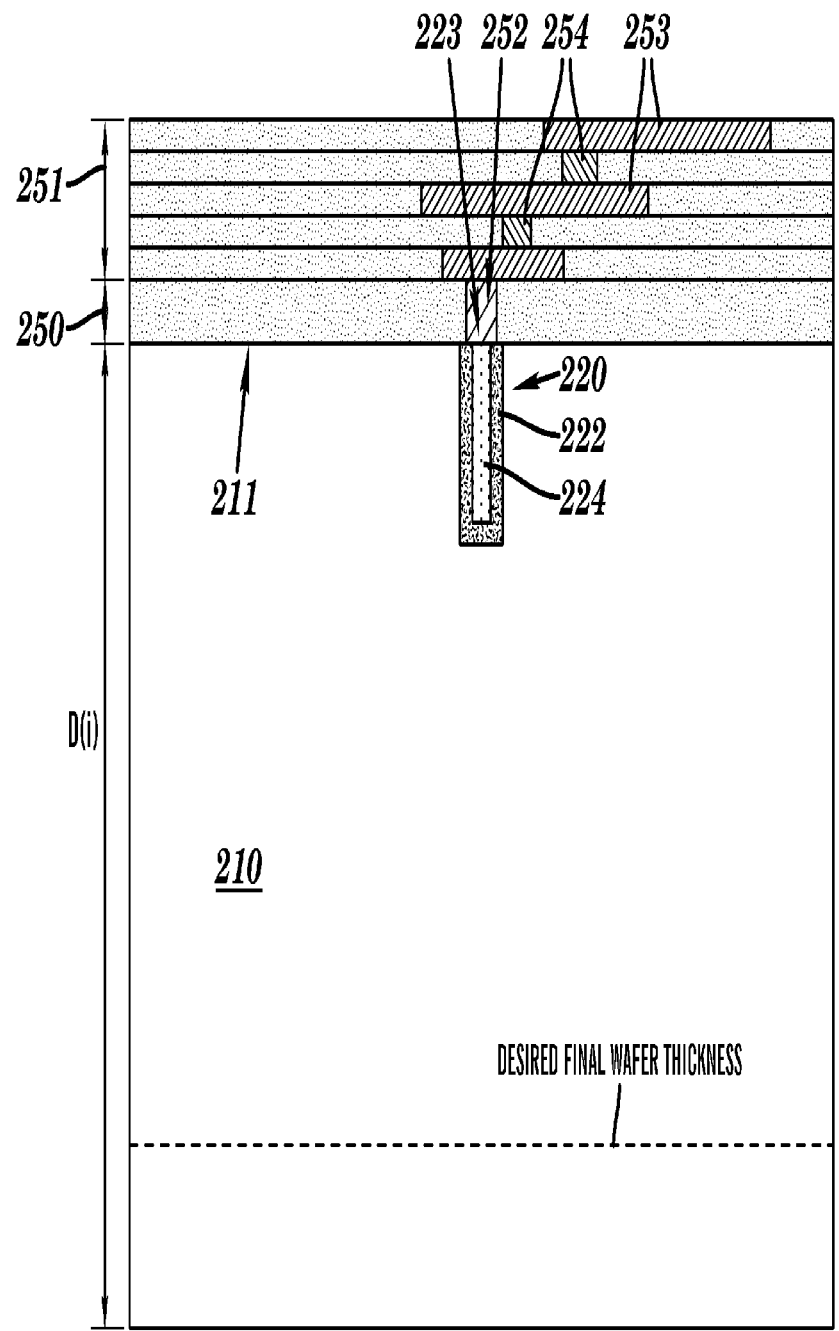

Another embodiment is illustrated in FIG. 2. Top section via 220 can be formed prior to BEOL processing. Top section via 220 can even be formed prior to building semiconductor devices (not shown) on top surface 211 of semiconductor substrate 210 which eliminates several process constraints. In some embodiments, it is advantageous to form liner 222 before fill material 224 is deposited. Liner 222 can be thermal oxide (i.e., an oxide layer formed on the surface by exposing a substrate, such as a silicon semiconductor substrate, to an oxidizing atmosphere at high temperature). Liner 222 can be formed at temperatures that might negatively impact the properties of earlier-formed devices. Further processing of substrate 210 can proceed after top section via 220 is filled (or at least plugged) by a fill material 224. As above, process considerations can dictate whether fill material 224 is deposited before or after any liner material is deposited, and if a liner is present, whether the fill material is deposited before or after removing such liner material that may have deposited over the top surface 211. Contact 252 abutting the top end 223 of the top section via 220 can be formed in dielectric layer 250 after removing unwanted fill material and liner material from top surface 211, such as by CMP. This contact can be formed immediately, or after additional processing and/or building semiconductor devices. Further BEOL interconnect metallization including lines 253 and vias 254 can be formed in further dielectric layers 251. Contact 252 can be a contact pad or via, comprising a conductive material, for example Cu or W.

Figure 4A:
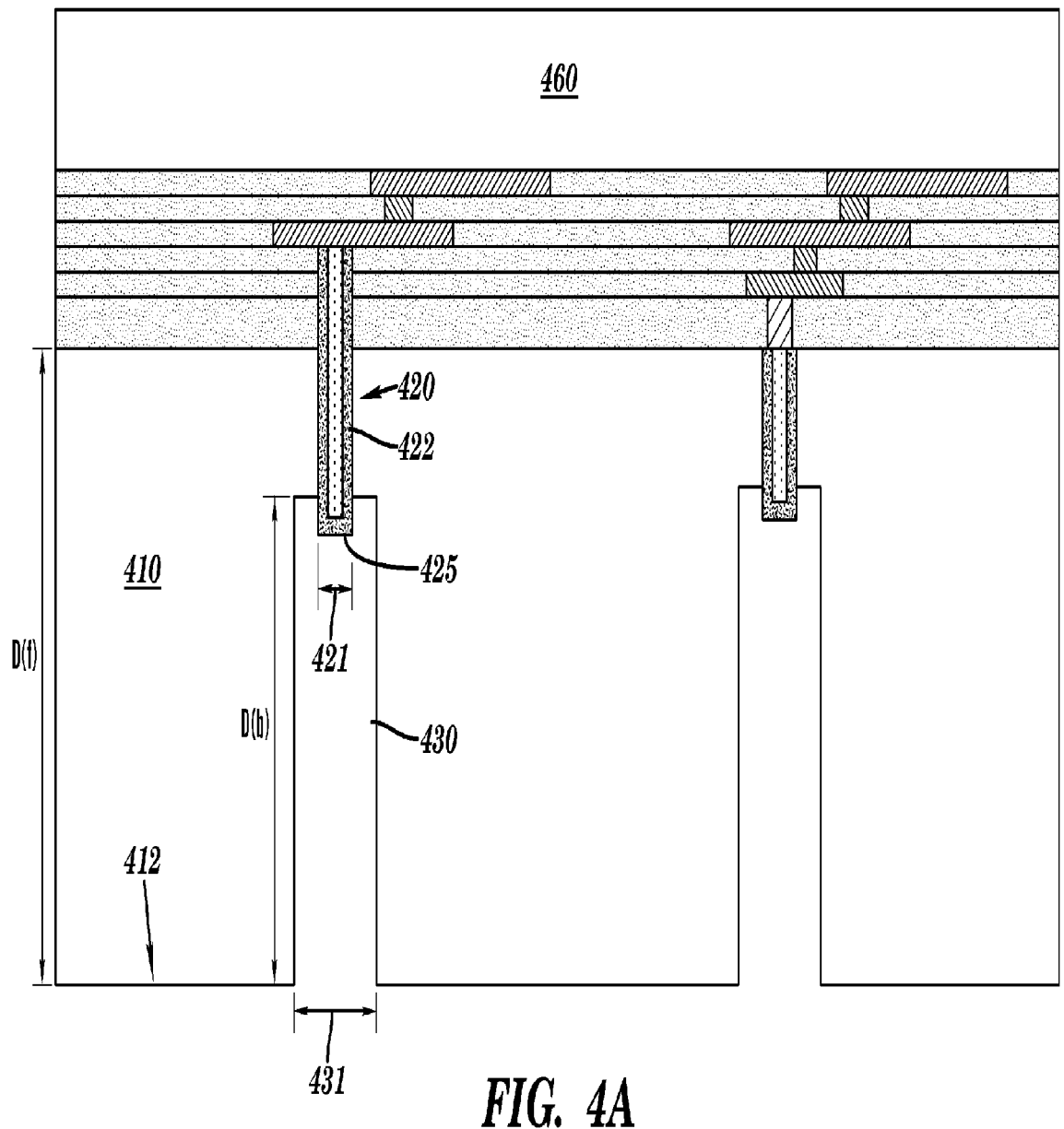
FIG. 4A -4C illustrate forming a multi-stage via using back-side processing.

FIG. 4A illustrates further processing of the embodiment of FIG. 1. The steps can similarly be applied to other embodiments (as suggested by the unlabeled via to the right of FIG. 4A). A carrier 460 is attached, which can be done as the last BEOL step, or after BEOL termination such as after application of BLM (patterned metal layer wettable for C4) or application of C4. Substrate 410 can then be thinned to the final thickness D(f), forming new bottom surface 412. Final thickness D(f) can be about 50 microns, but a thicker or thinner final thickness is also possible. Note that D(f) is greater than the depth D(top) to which the top section via extends within the substrate. Known etch processes can be used to form bottom via 430 through bottom surface 412 and at least partially expose the bottom end 425 of top via 420. Plasma etch can be preferable. Etch of via 430 can be performed to retain or remove (as desired) liner 422, if present, from exposed end 425 of the top via 420. As is known, the end point of the bottom via etch can be judged based on the etch emission spectra.

Bottom via length D(b) would typically be approximately the difference between substrate thickness D(f) minus D(top). Bottom via width 431 can be selected relative to length D(b) based on a manageable length to width (i.e., aspect ratio), which can be between 10 and 1, and can preferably be between 1.5 and 5. In some embodiments bottom section via width 431 can be equal to the top via width 421 (or if a section has a non-uniform cross section, then at least at the intersection of the top and bottom via sections). Generally, however, bottom via width 431 will be larger than top via width 421, and 431 may be 5 microns or greater.

Alignment of the bottom section to the top section can be accomplished as disclosed in co-pending application Ser. No. 12/987202, or by IR, or other known backside alignment techniques. IR can be advantageous given its minimal footprint and processing requirements.

Figure 4B:
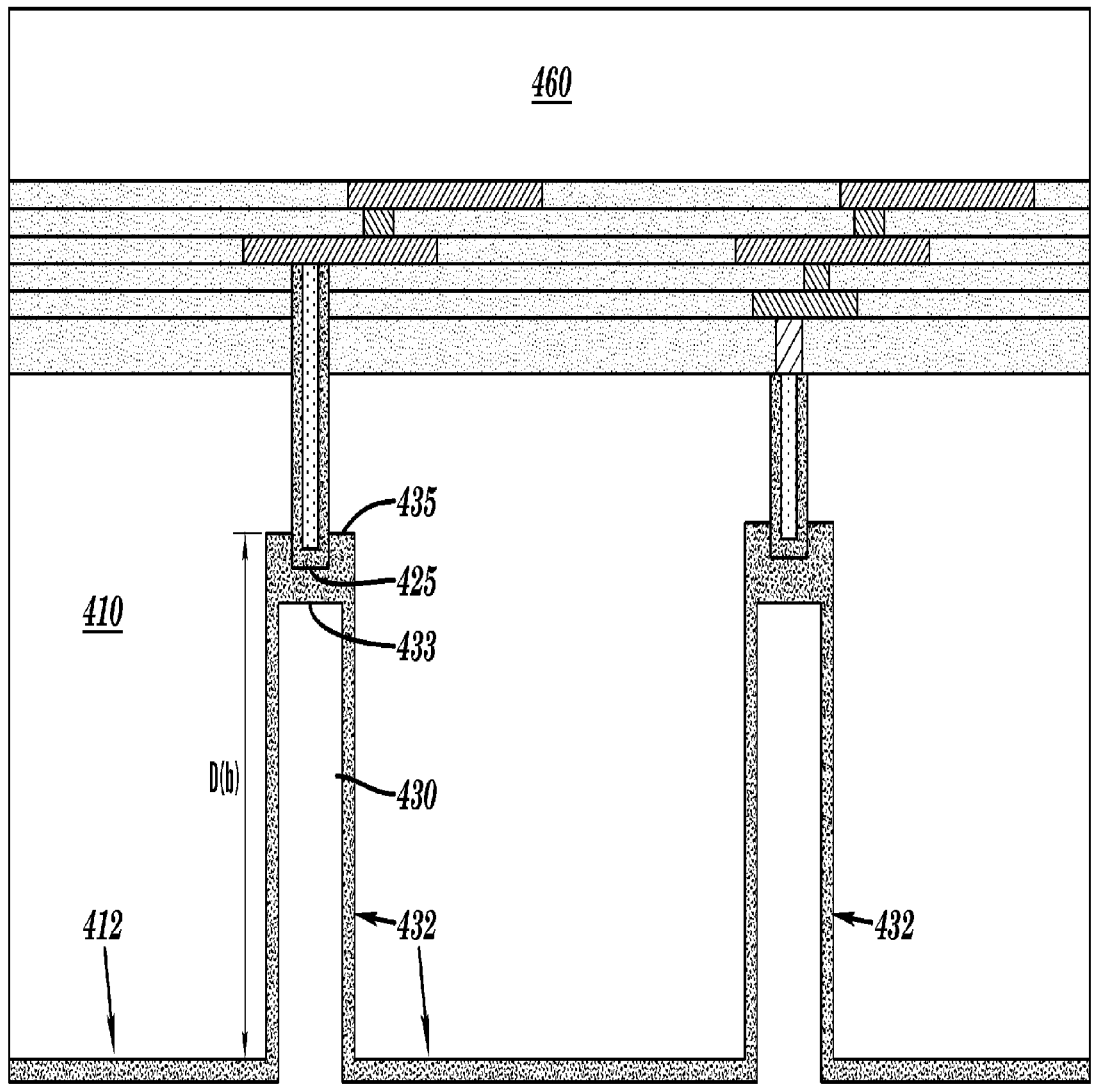

Referring now to FIG. 4B, liner 432 can be deposited over sidewalls of bottom section via 430 using known techniques to insulate the TSV. Liner 432 may also deposit over surface 412, and over the remote end 435 of bottom via 430. Liner 432 can be any conformal dielectric such as silicon oxide or silicon nitride and can be deposited by known techniques such as CVD. Depending on whether the top via was lined before fill material 424 was applied, on the relative cross section of the top and bottom via ends 425 and 435, the degree to which the bottom end 425 is exposed (i.e., the extent to which the top and bottom via sections overlap) and the material and deposition technique of depositing liner 432, the thickness of liner material at the junction of the top and bottom via sections may differ. If desired, a second deposition of flowable oxide or spin-on dielectric could be deposited to form a relatively flat bottom surface 433 of liner 432 at the remote end of bottom via section 430.

Figure 4C:
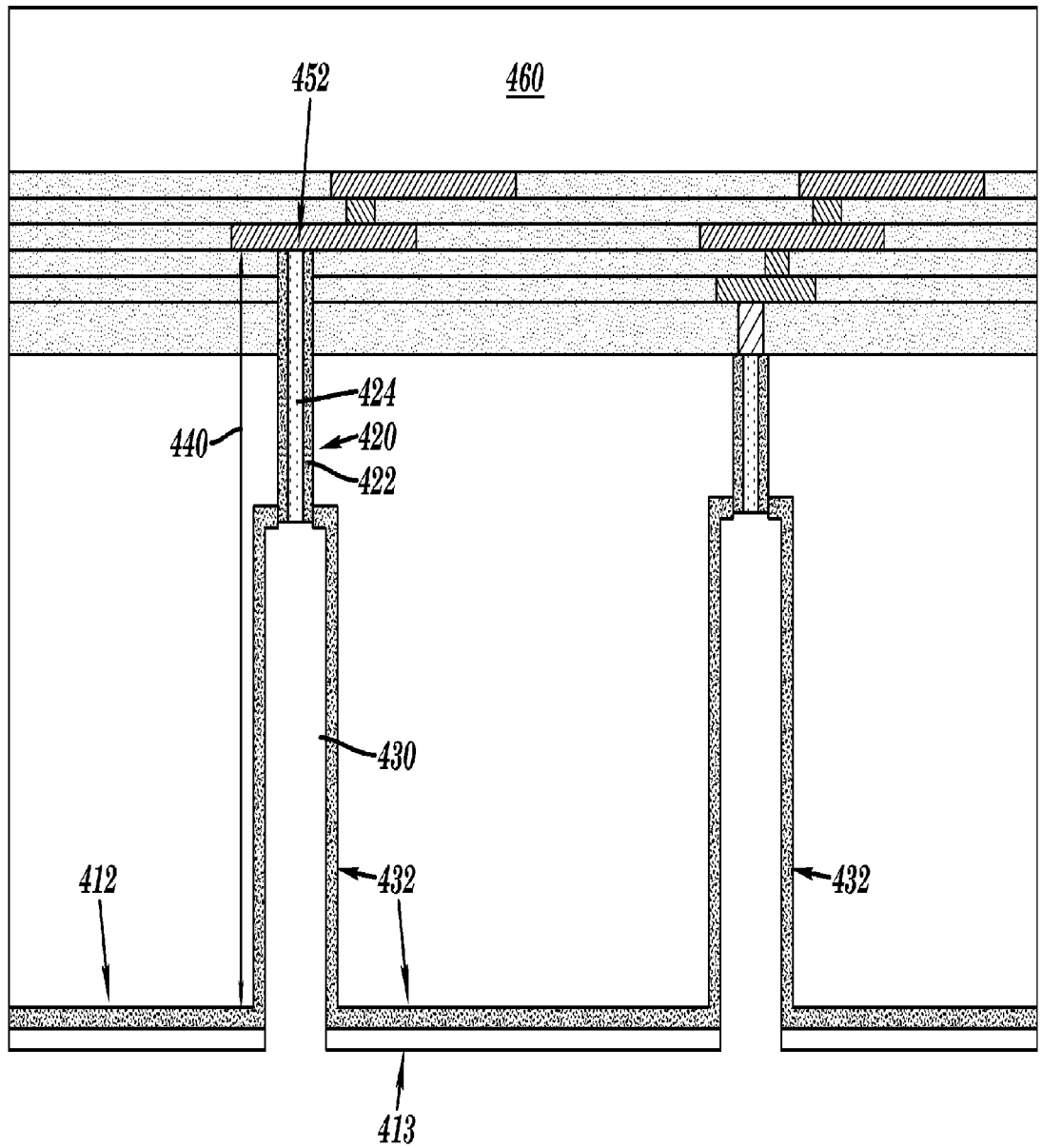

Referring now to FIG. 4C, anisotropic etch can remove liner 432, and if necessary liner 422 from via end 425, thereby joining the top and bottom via sections to make multistage via 440. Selective etch can remove the fill material 424 from the first via 420 and expose contact 452. By way of example, if the fill material were polysilicon and liner 422 were CVD oxide, then SF6 plasma etch chemistry could selectively remove the fill material to expose contact 452. It may be desirable to form a protective layer 413 over the substrate surface 412 before removing the fill material. Such protective layer 413 can be formed as part of liner 432, or may comprise an additional film formed of, for example, oxide, nitride, or metal or a carbon doped oxide, a nitrogen and hydrogen doped silicon carbide SiC(N,H) or multilayers thereof. Such additional film could be formed after deposition of liner 432 as shown, but it could alternatively be formed prior to forming via 430 or after forming via 430 and before forming the liner 432, such as by non-conformal deposition.

In yet another embodiment (not illustrated), after joining the top and bottom via sections and removing the fill material from the top section, a conformal lining can be deposited over the entire surface of the multistage via. Such lining can be a conformal dielectric liner like the dielectric liners already described. In some embodiments, the conformal lining can include a barrier or an adhesion layer. The conformal lining can include a TiN liner or a TaN/Ta bi-layer, such as if the TSV will have a conductive path formed of tungsten or copper respectively.

Figure 5A:
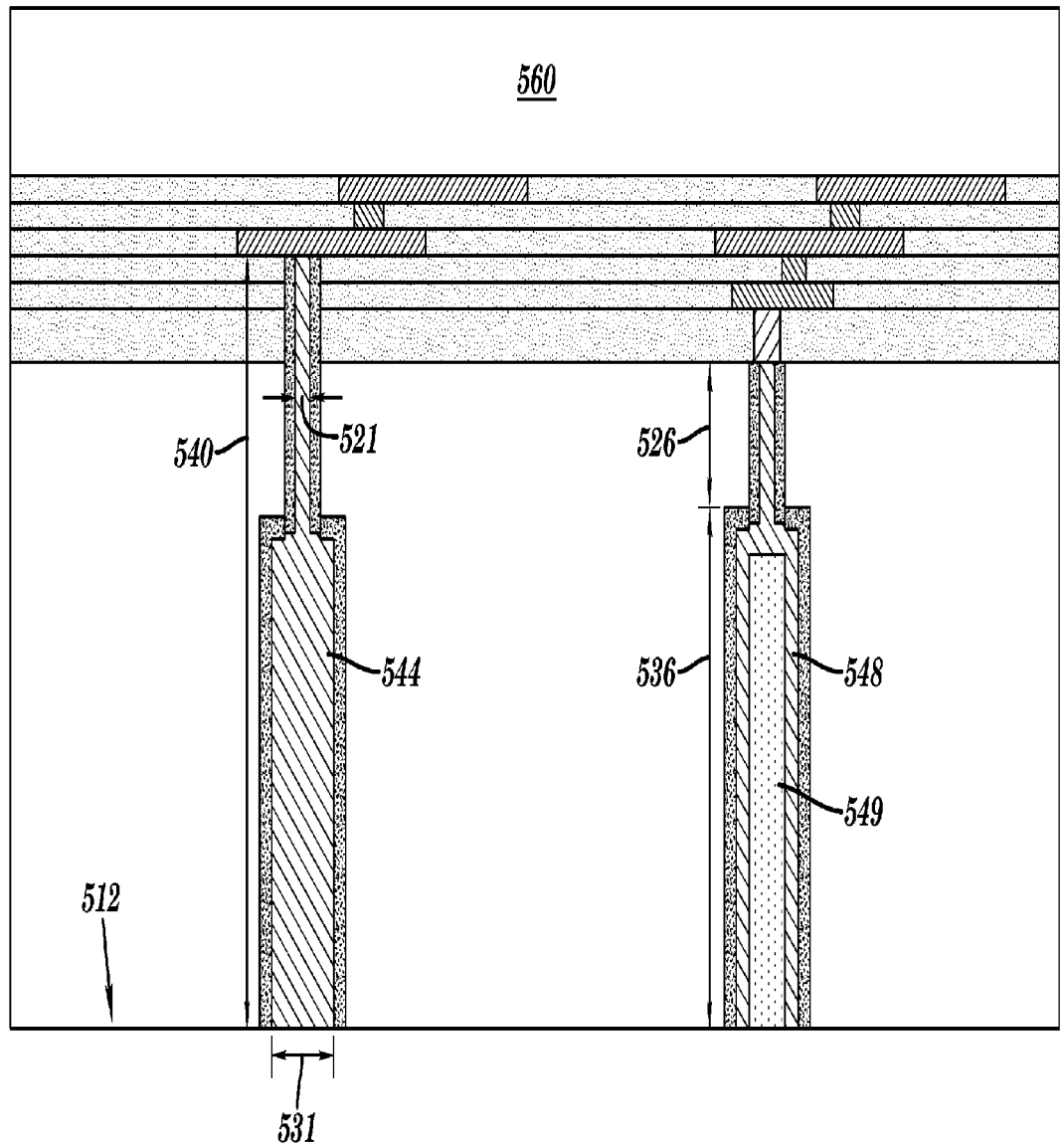
FIG. 5A and 5B illustrate a conductive TSV according to various embodiments of the present disclosure.

FIG. 5A illustrates TSV 544 which is formed by filling via 540 with conductive material. Depending on the conductive material, e.g., Cu or W, and the fill process, such as electroplating or WCVD, such fill process could be preceded by deposition of appropriate liner, barrier and/or seed layers. For a top via section sized at the current minimum dimension, void-free fill of the top section would be desirable.

If the bottom via cross section 531 is larger than the top via cross section 521, then a sufficiently large conductive path could be formed through via 544 without necessarily filling the bottom section via with conductive material. If desired, the metal fill process could fill the top section but just form a coating 548 of sufficient thickness on the bottom section surfaces. The remaining portion of the bottom section could be subsequently filled with, for example, a CVD/flowable oxide or organic dielectric 549. Importantly, TSV 544 can be formed by a single deposition process that forms a continuous conductive path through multistage via 540 without a liner (or barrier or other layer of any material) or any interface separating the upper section conductive fill 526 from the lower section conductive fill 536. After forming the TSV conductive path, excess materials disposed on bottom substrate surface 512 can be removed, such as by CMP, and chip processing can be continued or completed.

The conductive fill may comprise a conductive metal, an alloy comprising at least one conductive metal, a conductive metal silicide or combinations thereof. Preferably, the conductive material of TSV 544 is a conductive metal such as Cu, W or Al, with Cu or a Cu alloy (such as AlCu) being highly preferred in the present invention.

Figure 5B:
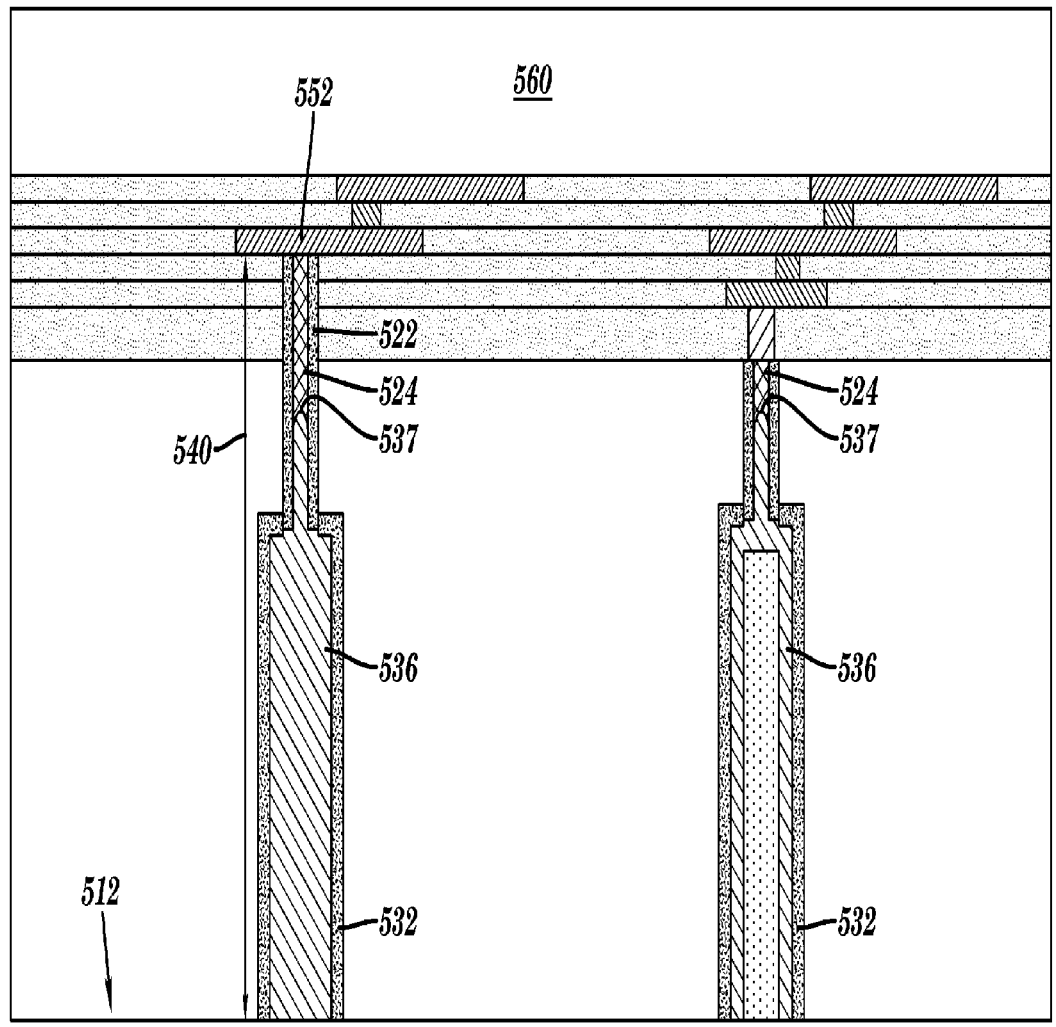

In another embodiment, it may be preferable to utilize the fill material in the top via section as part of the TSV conductive path. For example, as previously described, front-end and back-end processing can be completed after a top section via is lined and plugged. As shown in FIG. 4A, substrate 410 can be flipped and thinned after a carrier 460 is attached. Bottom via 430 can be etched through bottom surface 412 to at least partially expose the bottom end 425 of top via 420, and then lined as described with regard to FIG. 4B. Referring now to FIG. 5B, when top section via 520 is plugged with a conductive material, for example, liner 522 is thermal oxide and fill material 524 is polysilicon, then the top and bottom via sections can be joined to form multistage via 540 by anisotropic etch to expose but not remove top fill material 524. TSV 544 can be completed by completing a conductive path, that is by extending a conductive path 536 from an interface 537 with material 524 through top section via 520 and through bottom via 530 such that a conductive path extends continuously from bottom surface 512, through conductive path 536, through conductive material 524, to contact pad 552. As detailed above, path 536 can be formed in various shapes. It may be a solid plug completely filling the bottom via (as shown to the left), or an annular shape (as shown to the right), or even an asymmetric shape, so long as its conductive cross section is sufficient to carry design current capacity.

Figure 6:
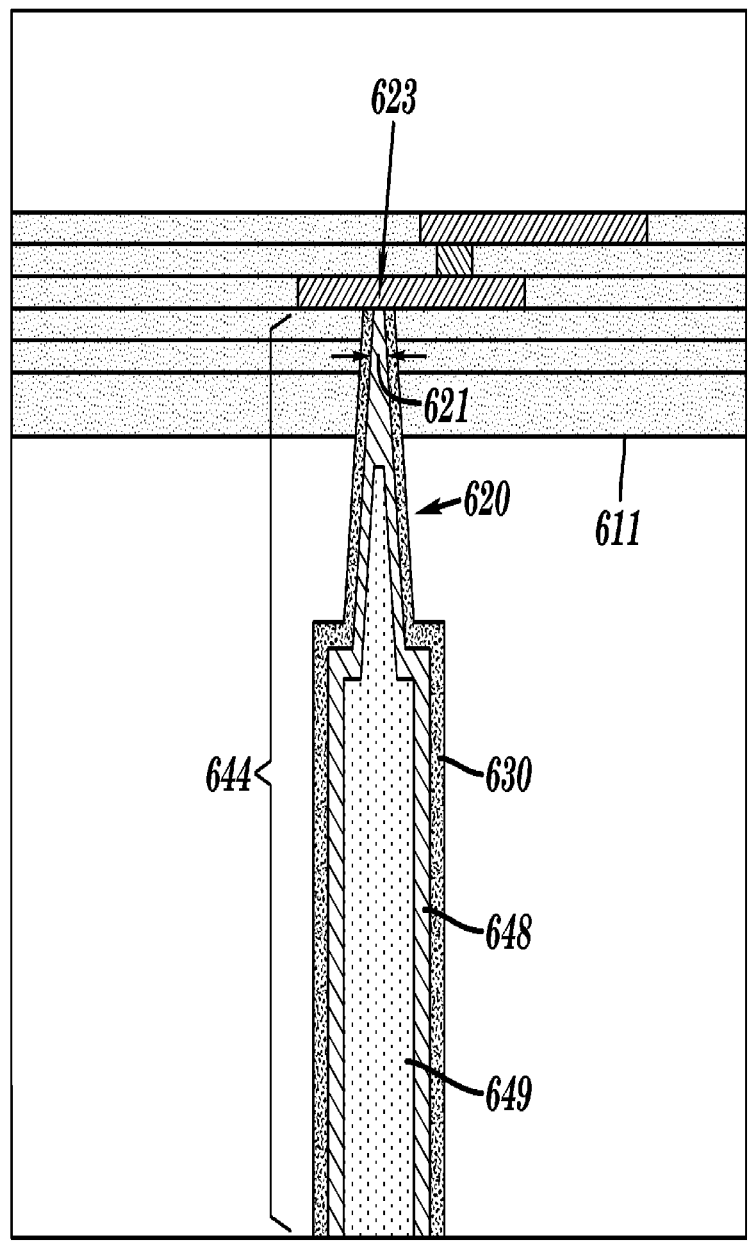
FIGS. 6 and 7 illustrate a conductive TSV according to other embodiments of the present disclosure.

FIG. 6 illustrates another embodiment wherein the top section via 620 is formed by retrograde etch, followed, as described above, by plugging the top section with fill material, then forming a bottom section via 630, joining the top and bottom sections, removing any fill material, and forming a conductive path with conductive material. The retrograde shaped top section provides an advantageous profile for depositing barrier, seed, and/or liner layers in the top via section, and as well as for forming the TSV conductive path from the thinned side of the wafer. A retrograde profile in the top section also minimizes the amount of area consumed by the TSV at the wafer top surface 611, resulting in increased area available for the formation of devices and circuits. Assuming the top end cross section 621 is the current minimum dimension under the design conditions of TSV 644, it would be desirable to void-free fill such top end 623. The entire multistage via could be filled with conductive material or, just as described above, a coating 648 of appropriate thickness could be formed over the sidewalls of the remaining depth of top section via 620 and also on the surfaces of via 630, with any remaining volume subsequently filled with a dielectric 649. The multistage via illustrated in FIG. 6 is just one of many possible combinations in which the top section or the bottom section or both have a non-uniform cross section.

Figure 7:
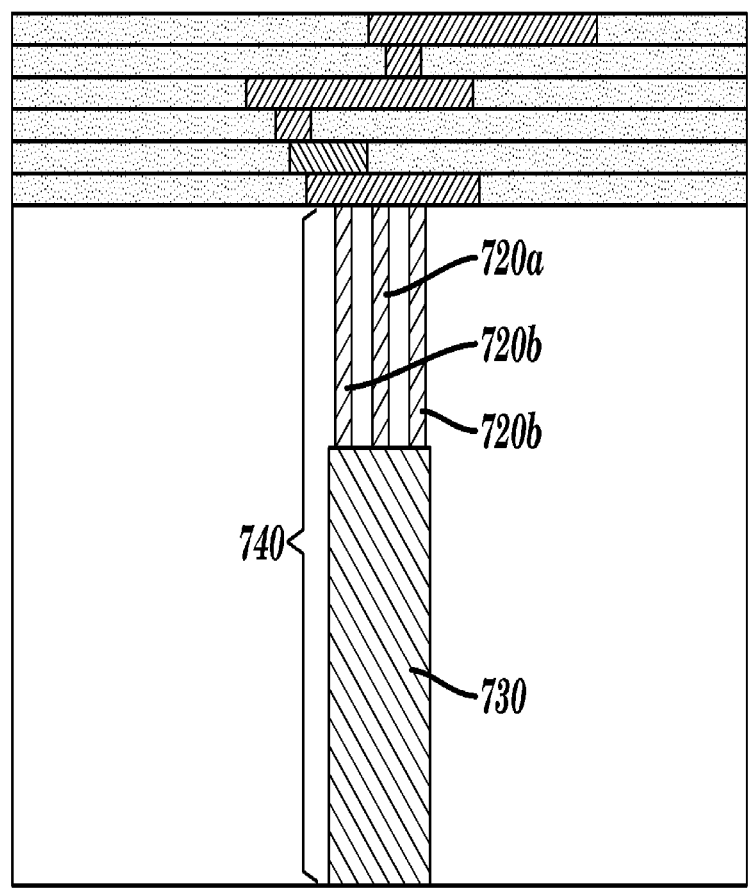

FIG. 7 illustrates yet another embodiment of a multistage via 740 according to the present disclosure, formed by joining a plurality of small top vias 720a and 720b with bottom side via 730. This may be useful when the current minimum dimension is larger than the typical dimension for the process layer selected for forming such top via sections. A conductive path can be formed by filling the entire via 740 with conductive material or by forming a coating of appropriate thickness as described above. Alternatively, the top section vias 720a and 720b could be filled with one conductive material, such as W or polysilicon, and a different conductive material, such as Cu, could complete the conductive path through the bottom section 730. Top vias 720a and 720b can be identical or can differ, that is, for example, they can have same or different cross sectional area, or they can be etched from different process levels. Top section vias 720 can be formed according to any of the foregoing process descriptions, and optionally all top vias 720 are formed simultaneously.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method to form a via through a substrate having a front side, a back side, and an initial depth, the method comprising:
   providing said substrate having a blind via formed through said front side, said blind via having a front end sealed by fill material, and said blind via filled with said fill material, said front end abutting a contact disposed above said front side, said blind via having a back end within said substrate, said blind via extending into said substrate less than said initial depth;
   forming a back side via that extends through said back side and opens said back end to form a multi-stage cavity;
   forming a protective layer on a surface of said substrate comprising a nitrogen and hydrogen doped silicon carbide;
   removing said fill material to expose said contact;
   further comprising conformally depositing a conductive material on the contact and over sidewalls of said back side via; and
   filling the back side via with a dielectric material, thereby forming an annular conductive path.

2. The method of claim 1 further comprising prior to said step of providing said substrate:
   forming said blind via through said top surface,
   applying fill material to seal said front end, and
   forming said contact abutting said top end.

3. The method of claim 2 wherein at least one semiconductor device is formed in said front side after said step of forming said blind via.

4. The method of claim 1 further comprising prior to said step of forming a back side via:
   attaching a carrier to said substrate;
   removing a layer of said back side whereby said substrate achieves a final depth, wherein said blind via extends into said substrate less than said final depth.

5. The method of claim 1 wherein said blind via is lined with thermal oxide.

6. The method of claim 2 wherein said blind via is formed by retrograde etch.

* * * * *